Dec. 22, 1964 M. HILSENRATH ETAL 3,162,771

HIGH SPEED TRANSISTOR AMPLIFYING SWITCH HAVING
ISOLATING AND SECOND TRANSISTOR TURN-OFF MEANS
Filed June 16, 1961

INVENTORS
MANFRED HILSENRATH
ROBERT C. PAULSEN
BY Harry T. Berriman
AGENT

United States Patent Office 3,162,771
Patented Dec. 22, 1964

3,162,771
HIGH SPEED TRANSISTOR AMPLIFYING SWITCH HAVING ISOLATING AND SECOND TRANSISTOR TURN-OFF MEANS

Manfred Hilsenrath, Hyde Park, and Robert C. Paulsen, Rabbit Trail, N.Y., assignors to International Business Machines Corporation, New York, N.Y., a corporation of New York Filed June 16, 1961, Ser. No. 117,597
4 Claims. (Cl. 307—88.5)

This invention relates to semi-conductor voltage amplifier circuitry. More particularly, this invention is directed to a high speed semi-conductor switching device of an emitter follower configuration which provides voltage amplification.

Circuit development in the digital computer and allied fields is becoming increasingly directed towards the problem of speed. As logical techniques and programming theories advance, increases in operating speeds of the machine itself are required to render operation of the computer more versatile and less expensive. The quest for increased speeds narrows itself down to the basic circuit blocks out of which the computers are fabricated. Any speed increase achieved at this level is multiplied innumerable times when extrapolated over the entire computer organization.

Many present day computers are practically all solid state, most of the active elements being of the semi-conductor or magnetic core type. Transistors and diodes are used to provide the switching elements required in the logical circuitry of the machine, while magnetic cores are more generally used for storage and memory purposes. The transistor, when used as a switch, suffers from internal speed limitations. For example, in a junction transistor a finite time is required for minority carriers to cross the base region and start collector current flow once the emitter-base diode is forward biased. This same problem occurs in reverse when the transistor is subsequently biased into nonconduction, it takes a finite time for the minority carriers already in the base region to be "cleared up." Attempts to reduce these turn-on and turn-off delays have followed two avenues; the internal make-up of the transistor has been varied in an attempt to reduce the transit time through the base region, and other efforts have been toward modifying external circuitry to prevent or compensate for this delay. The present invention is in this latter area and enables presently available transistors to be used in switching circuits operating at speeds heretofore not achieved. In addition to the enhanced switching speed characteristics, the invention also provides a unique voltage amplification in the so-called emitter follower class of semi-conductor switching devices, this amplification having been unobtainable in this class of devices heretofore.

Accordingly, it is a primary object of the invention to provide a basic voltage switch which performs its logical function at extremely high speed.

It is another object to provide a solid state emitter follower switching circuit which provides voltage amplification and effects switching action at speeds heretofore not attained.

Another object is to provide a fast switching solid state emitter follower circuit which provides voltage gain without particular limit on the output voltage swing and which can be used as a voltage level setter.

Another object of the invention is to provide novel means for providing both a high speed switching circuit and voltage amplifier.

Briefly this invention comprises a junction transistor connected in an emitter-follower configuration with a semi-conductor diode having negative resistance characteristics over most of its operating range being placed across the base-emitter junction of the transistor. The transistor is normally biased to a nonconductive state with the negative resistance diode being also biased to a low voltage state. Upon the application of an input pulse of proper polarity to the base of the transistor and to the diode, the negative resistance diode rapidly switches to its high voltage state. Even before switching occurred the high conductivity of the tunnel diode permitted the signal to appear across an emitter load resistor of the transistor and after switching drives the transistor toward an equilibrium heavy conduction state. The signal input circuit includes a second diode which back biases as the transistor switches towards its heavy conduction state to isolate the emitter follower from the input. By proper choice of emitter load resistance and other circuit parameters, including the isolating diode, the change in conduction of the transistor can provide a voltage swing at the emitter larger than the magnitude of the input signal and thus give a fast acting emitter follower switch with a further benefit of voltage amplification. Reset means comprised of another transistor are provided to return the diode to its low voltage state, this transition, in turn, turning the transistor from its conductive to is nonconductive state. This combination of a transistor, a negative resistance diode, and other circuit parameters accordingly provides a fast acting emitter follower with the additional voltage amplifying characteristic.

The foregoing and other objects, features, and advantages of the invention will be apparent from the following more particular description of a preferred embodiment of the invention as illustrated in the accompanying drawings.

Figure 1:
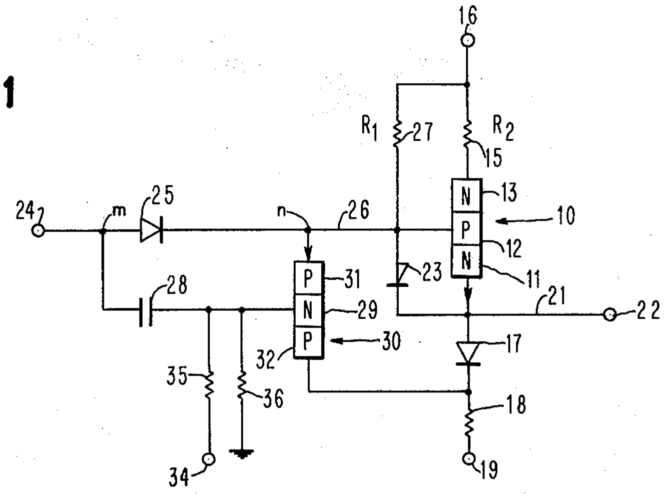
FIG. 1 is a circuit diagram of a switching and amplifying circuit according to the invention.

Referring now to FIG. 1, the invention comprises a fast NPN junction transistor 10 having the usual emitter 11, base 12, and collector electrodes 13. The collector 13 is connected through a suitable resistor 15 to a positive potential source 16 while the emitter 11 is connected through a diode 17 and a load resistor 18 to a negative potential source 19. The output for the circuit is taken from the emitter 11 through conductor 21 to the output terminal 22.

Connected in parallel with the base-emitter circuit of transistor 10 is a two terminal negative resistance device 23, the base 12 of the transistor also being connected through a resistor 27 to the positive potential source 16. Input signals are applied from a source 24 through a diode element 25 and conductor 26 to the base of transistor 10, these signals, of course, also being applied to the anode terminal of the negative resistance device 23 as evident from the diagram.

The input signal source 24 is also connected through a capacitor 28 to the base 29 of a PNP junction transistor 30. The emitter 31 of transistor 30 is connected to the conductor 26, while the associated collector 32 is connected between diode 17 and resistor 18, as shown. A biasing circuit for the base of transistor 30 extends from a positive potential source 34, through a resistor 35 to the base electrode 29, and then through another resistor 36 to ground.

Figure 2:
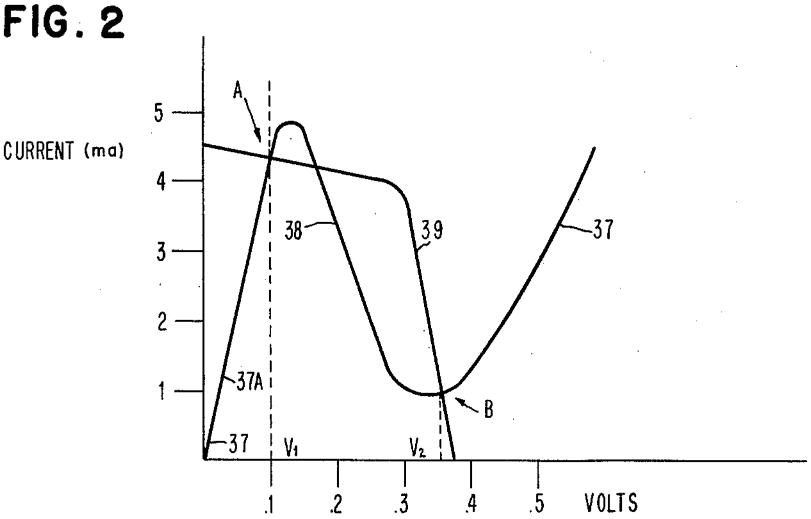
FIG. 2 is a combined plot showing the negative resistance characteristic of a diode used in the invention and the emitter-base characteristic of a transistor used in the invention.

The current versus voltage characteristic of the negative resistance device 23 used in the circuit of FIG. 1 is shown in FIG. 2 and designated 37. The characteristic includes a negative resistance portion 38 between the points A and B. Point A may be defined as a low resistance of impedance point while point B is a high resistance point. As is apparent from FIG. 2, if the voltage applied to the device is increased through its region of negative slope, the current through the device decreases. If in one condition the circuit in which the device is used has impedance and voltage value such that the device operates at point A, the voltage across the device will be $v_1$ and the device is in a stable high current-low voltage state.

With an increase in applied voltage sufficient to move the load line of the device past the extreme high current peak the device will shift to operational point B wherein the voltage across the device will be at point $v_2$ and the device is in a stable low current-high voltage state. One such device which exhibits the above characteristics is known as a tunnel diode. This device is a heavily doped junction diode and is therefore extremely compatible for use in transistor circuits. The negative resistance characteristic of the tunnel diode is present in its forward conducting direction, the positive or anode being the input terminal and the output being taken at its cathode or negative electrode. A more detailed description of this device may be found in an article by Leo Esaki, appearing in the Physical Review, for January 15, 1958, entitled: "New Phenomenon Narrow Germanium P-N Junctions." It will be realized, of course, that any type of device exhibiting the negative resistance characteristic required by the circuit will be suitable.

Referring now to FIG. 1 and 2, with the diode 23 placed across the base-emitter junction of transistor 10, the transistor can only exist in two possible states: cutoff or a low conductive state when the diode 23 is in its low voltage state, or heavy conduction at a particular point of the transistor characteristic corresponding to an intersection of the diode and base-emitter characteristic. The base-emitter characteristic of transistor 10 is designated in FIG. 2 as 39. These two points are designed to set up equilibrium for the two devices and must fall into the stable region of the diode 23 as shown in FIG. 2. Assuming at first that transistor 10 is in its cutoff state, the load line for diode 23 is then dependent upon the values of resistors 27 and 18, and the characteristic for transistor 10 intersects the diode characteristic 36 at point A below the peak tunnel current. This point is on a flat portion of the diode load line 37 and diode 23 is accordingly in a stable state at point A while transistor 10 is in its so-called cutoff state. Thus when the input 24 is at a zero state, point *m* (FIG. 1) is at a similar "zero" state, point *n* is in the "zero" state although slightly less negative than point *m* due to a voltage drop across diode 25, while the output 22 is also in the "zero" state although still slightly more negative than point *n* due to the voltage drop across diode 23.

Figure 3:
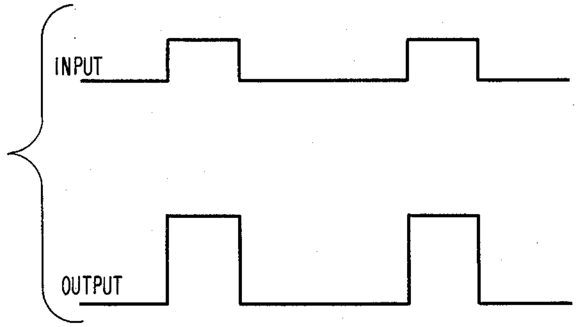
FIG. 3 is a waveform diagram of the input and output signals for the circuit.

Assume now that input 24 switches positive to a predetermined one state as indicated in FIG. 3. Since diode 25 is connected in its forward or low impedance direction relative to input 24, as the input point *m* swings positive, point *n* will follow. Similarly since diode 23 is also connected in its low impedance direction relative to point *n*, the output 22 will follow point *n* positive. It is thus evident that by reason of the low impedance path, the output 22 substantially follows the positive shift of the input 24 with little delay. As the voltage V across diode 23 increases, the current through the diode 23 increases. When the current exceeds the peak tunnelling current of diode 23, the diode rapidly switches to its high voltage state B. Since the diode 23 is then not only in a high voltage state, but also in a high impedance state, part of the current through resistor 27 flows into the base electrode 12 of transistor 10. As the diode 23 switches so fast compared to the transistor 10, the transistor sees in effect, the insertion of a current generator due to diversion of current from resistor 27 simultaneously with the switching of the input. As transistor 10 switches from its cutoff state, increasing emitter current flows and the output voltage at point 22 rises further. Since the voltage across diode 23 is fixed at point B, the base of transistor 10 together with the emitter rises to a new equilibrium point at point B where the transistor is in saturation. Thus the base of transistor 10 will have a higher potential than the input 24 in its one state and diode 25 is reverse biased. Without diode 25, the base of transistor 10 could not exceed the input level applied to 24. Thus it is evident that by the input signal switching from a zero state to a positive one state sufficient to force enough input current through the diode 23 to just exceed the peak tunnelling current thereof, a considerably longer swing from a zero to a one state in the output from terminal 22 is obtained (see FIG. 3). The output from terminal 22 accordingly not only exhibits voltage gain over the input, but becomes independent of the input level by reason of the back biasing of diode 25.

To review the circuit operation in brief, diode 23 is a bistable element which either keeps the current of transistor at zero or turns it on to full conduction. Diode 25 couples the positive input step in order to change the state of diode 23 and also after the diode changes state, is back biased by the transistor base-emitter circuit to isolate the input 24 from the output 22 and permit the output 22 to rise above the input thus giving voltage amplification.

Of primary interest are the delay and rise times of the circuit. Reviewing these, it was explained above that while the input and output are in the zero state, diode 25 is forward biased and diode 23 is in the low voltage state. These two diodes are the only two series elements between input 24 and output 22, and both are in a low impedance state. Thus the input 24, in effect, is directly coupled to the output 22. As long as diode 23 does not switch state, the output will just follow the input. When the input switches from the "zero" to the "one" state, the output will at first follow the input. When the peak tunnelling current of Esaki diode 23 is exceeded, diode 23 as well as transistor 22 switches and the output overtakes the input. The important point to note is that even before switching has occurred, the output followed the input. The net result obtained then is an emitter follower transistor configuration which switches rapidly with minimal delay and wherein voltage amplification occurs, the ultimate output level reached being independent of the input. With this latter characteristic it is evident that the circuit can also be used as a voltage level setting device, if desired.

With the transistor 10 in its saturated condition and output 22 at its positive "one" state, the circuit is restored to its "zero" state in the following manner:

It will be recalled that the input 24 is coupled through capacitor 28 to the base of a PNP transistor 30. The bias circuit comprised of supply 34 and resistors 35 and 36 normally bias the transistor 30 off, the base of transistor 30 being biased to a voltage equal to the output plus the voltage drop across diode 23 in the high voltage state. This prevents the base of transistor 12 clamping to the base of transistor 30.

As the input 24 switches from its positive "one" to its "zero" state, the negative going shift of terminal 24 is applied through capacitor 28 to the base electrode 29 to drive transistor 30 conductive. It will be noted that the diode 17 is connected between the collector output of transistor 10 and the resistor 18. This series element which could just as well be a resistor does not alter the operation of the circuit as previously described, but merely provides the necessary collector voltage to permit transistor 30 to be turned ON when its base shifts negative. As transistor 30 conducts, it momentarily draws enough current through resistor 27 away from diode 23 to take it below the valley of the current in FIG. 2, the diode action accordingly following the characteristic curve along the flat portion 37a of the curve to the high current low voltage state at point A. With the diode in this latter state, the transistor 10 restores to its nonconductive state and the output 22 drops to is "zero" state. The transistor 30 after the passage of the negative going shift as a result of input 24 dropping from the "one" to "zero" state, again reverts to its nonconductive state (point A).

Typical values of the various circuit components shown in FIG. 2 are as follows:

| | |
|---|---|
| Potentials **16** and **34** | +6 volts. |
| Potential **19** | −6 volts. |
| Input signal: | |
| Level terminal **24** | ±1 volt. |
| Output signal: | |
| Level terminal **22** | −1 to +3 volts. |
| Resistor **27** | 1.7K ohms. |
| Resistor **15** | 560 ohms. |
| Resistor **18** | 1.1K ohms. |
| Resistor **35** | 1K ohm. |
| Resistor **36** | 750 ohms. |
| Characteristics: | |
| Tunnel diode **23** | 5 ma. peak current, 1 ma. valley current, 20 μμf. capacity. |
| Characteristics: | |
| Transistor **10** | Npn., $w_2=2\pi\times300$ mc., IBM Type 0A5. |
| Characteristics: | |
| Transistor **30** | Pnp., IBM Type 015. |

Capacitor 28=approx. 10μμf. or $$=\text{to}\ \frac{\text{input signal repetition rate}}{3\times 1\text{K}}$$

With the circuit of FIG. 2 having component values as indicated above and with the input signal having a rise time of 35 mu-sec., the delay between the output and input is in the range of 4 mu-sec. This result is effected with a voltage swing of about 400 mv. to which the diode 23 is limited as shown in FIG. 2. Thus delays of the range of 4–5 mu-sec. are obtained with total output swings of 4 volts. The above results are not intended to limit the invention but to indicate approximate results with certain components. Thus, for example, if a 5 μμf. capacity diode 23 and 1K mc. transistors 10 and 30 are used, then time delays and rise times would be further shortened.

The improved circuitry accordingly provides very fast transistor emitter follower action with voltage amplification between the input and output.

While the invention has been particularly shown and described with reference to a preferred embodiment thereof, it will be understood by those skilled in the art that various changes in form and details may be made therein without departing from the spirit and scope of the invention.

What is claimed is:

1. A signal amplifying switch comprising a transistor having base, collector and emitter electrodes with a signal output terminal being connected to said emitter electrode, first and second potential sources, an impedance connected between said collector electrode and said first potential source, an impedance connected between said emitter electrode and said second potential source, a tunnel diode connected in a forward direction between said base and emitter electrodes, means biasing said transistor to a normal low conductive state and said tunnel diode to a stable low voltage high current stable state, input signal means including an isolation circuit for applying an input signal which swings from a first level to some predetermined second level to said tunnel diode to switch it to a stable low current high voltage state and effect a corresponding switching of said transistor to a high conductive state, said switching being effective through the base emitter circuit of said transistor to render said isolation circuit operative to disconnect said input signal means from said tunnel diode and permit said diode to determine the final level of the output signal at a level of greater magnitude than said predetermined level of said input signal, and a second transistor circuit means responsive to the restoration of said input signal from said predetermined level back to its first level to restore said tunnel diode from its low current high voltage state to its high current low voltage state and effect a corresponding restoration switching of said first transistor.

2. An amplifying signal switching circuit comprising a first transistor having base, collector and emitter electrodes with a signal output terminal being connected to said emitter electrode, first and second potential sources, a first impedance connected between said collector electrode and said first potential source, second and third series connected impedances connected between said emitter electrode and said second potential source, said second impedance being a diode connected to said emitter and in a forward direction away therefrom, a tunnel diode connected in a forward direction between said base and emitter electrodes, means maintaining said transistor in a normal low conductive state and said tunnel diode in a stable low voltage high current state, input signal source means including a diode connected in a forward direction between said source and said base connection of said tunnel diode for applying an input signal to said tunnel diode to switch it to a stable low current high voltage state and effect a corresponding switching of said transistor to a high conductive state, a second transistor having base emitter and collector electrodes, the emitter electrode of said second transistor being connected to the base electrode of said first transistor and the collector electrode being connected to the junction of said second and third impedances, means normally maintaining said second transistor in a nonconductive state, and circuit means interconnecting said input signal means and said base electrode of said second transistor wherein restoration of said input signal towards a normal no input signal state renders said second transistor conductive to restore said tunnel diode from its low current high voltage state back to its high current low voltage state and switch said first transistor from its corresponding high conductive state to its low conductive state.

3. A high speed switch comprising in combination a first transistor having collector, base, and emitter elements, an output terminal linked to said emitter, a series impedance circuit means extending from said emitter to a negative supply source, a tunnel diode connected in a forward direction between said base and emitter electrodes, a second impedance means connected between said collector and a said positive supply source, a third impedance means coupling said base element of said transistor to said positive potential supply, said supply providing current through said impedance means to normally maintain said diode in an initial low positive resistance state and said transistor in a related initial low conductive state, input signal means connected to said tunnel diode for applying an input signal to transfer said diode to its high positive resistance point, said transfer diverting current supplied through said third impedance from said tunnel diode to said base element to effect a transfer of said transistor to its high conductive state, an isolation element interposed between said input signal means and said tunnel diode to disconnect said input signal means from said transistor base once the tunnel diode starts to transfer to its high positive resistance point, a second transistor having an emitter base and collector elements with the collector element being connected to said series circuit and the emitter element being connected to the base element of said first transistor, means normally biasing said second transistor to a nonconductive state, and circuit means connecting said input signal means to the base element of said second transistor and responsive to the removal of the input signal to render said second transistor conductive and restore said tunnel device and the first transistor to their initial states.

4. The circuit of claim 3 further characterized that said first and second transistors are of the alternate conductive types.

References Cited in the file of this patent

UNITED STATES PATENTS

| | | |
|---|---|---|
| 2.887,613 | St. John | May 19, 1959 |
| 2,892,952 | McVey | June 30, 1959 |
| 2,900,530 | Rowland | Aug. 18, 1959 |
| 3,102,209 | Pressman | Aug. 27, 1963 |

OTHER REFERENCES

Lesk et al.: "Electronics," page 64, Nov. 27, 1959.

Mauch: "Electronic Industries," page 107, February 1961.